(12) United States Patent
Hamilton (10) Patent No.: US 9,912,346 B1
(45) Date of Patent: Mar. 6, 2018

(54) DIGITAL-BASED POWER REDUCTION TECHNIQUE FOR SAR ADCS

(71) Applicant: Ambiq Micro, Inc., Austin, TX (US)

(72) Inventor: Joseph Hamilton, Austin, TX (US)

(73) Assignee: Ambiq Micro, Inc., Austin, TX (US)

( * ) Notice: Subject to any disclaimer, the term of this patent is extended or adjusted under 35 U.S.C. 154(b) by 0 days.

(21) Appl. No.: 15/486,795

(22) Filed: Apr. 13, 2017

(51) Int. Cl.
*H03M 1/38* (2006.01)
*H03M 1/46* (2006.01)
*H03M 1/18* (2006.01)
*H03M 1/12* (2006.01)

(52) U.S. Cl.
CPC ........... *H03M 1/38* (2013.01); *H03M 1/1245* (2013.01); *H03M 1/182* (2013.01); *H03M 1/462* (2013.01)

(58) Field of Classification Search
None
See application file for complete search history.

(56) References Cited

U.S. PATENT DOCUMENTS

| 7,498,962 B2 * | 3/2009 | Alfano | G06F 1/08 341/122 |
| 8,633,844 B2 * | 1/2014 | Piasecki | H03M 1/468 341/155 |
| 9,209,824 B2 * | 12/2015 | Shen | H03M 1/12 |

FOREIGN PATENT DOCUMENTS

| JP | 05343998 A | * 12/1993 | ............ H03M 1/462 |
| JP | 11154866 A | * 6/1999 | |
| JP | 2006108893 A | * 4/2006 | |

OTHER PUBLICATIONS

Stankovic et al. Power Reduction Technique for Successive-Approximation Analog-to-Digital Converters, TELSIKS 2007, Serbia. Sep. 2007. IEEE.*
Machine translations of JP11-154866A & JP05-343998A pdf files appended to respective JP references above.*

* cited by examiner

*Primary Examiner* — Howard Williams
(74) *Attorney, Agent, or Firm* — Hunt Pennington Kumar & Dula PLLC; Artie Pennington; Jeffrey Van Myers (57) ABSTRACT

A method for pre-loading a SAR ADC with an initial value for a selected range of high-order bits. If the ADC resolves at either an upper or a lower limit set by the pre-loaded value, the ADC may discard the pre-loaded value and perform a full search. Alternatively, the ADC may perform one or more "bonus steps" before giving up and performing a full search.

10 Claims, 10 Drawing Sheets

Prior Art

Fig. 3

Prior Art

DIGITAL-BASED POWER REDUCTION TECHNIQUE FOR SAR ADCS

BACKGROUND OF THE INVENTION

1. Field of the Invention

The present invention relates to a digital-based method and apparatus for reducing power in a Successive-Approximation ("SAR") Analog-to-Digital Converter ("ADC").

2. Description of the Related Art

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single integrated circuit ("IC"), or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice.

A frequent ADC topology of choice for past, present, and likely future MCU products is a SAR ADC. In general, this is a good choice for a medium-resolution, medium-speed, general-purpose Nyquist ADC.

Many of the applications for the ADCs in typical MCU products require the quantization of very low frequency inputs. In the interest of maximizing power efficiency, a duty-cycled ADC system based around a fast, high-power ADC is often used. Because these ADC systems are intended for various applications with different random noise levels, some products include a feature that takes a programmable number of samples in a row and averages them to improve the precision of the final result. Doing so can theoretically achieve an additional bit of resolution for a four-hold increase in the number of averaged samples. Because the ADC samples and quantizes much faster than the bandwidth of the input signal, both the input voltage and ADC output are nearly identical between consecutive samples.

Figure 1:
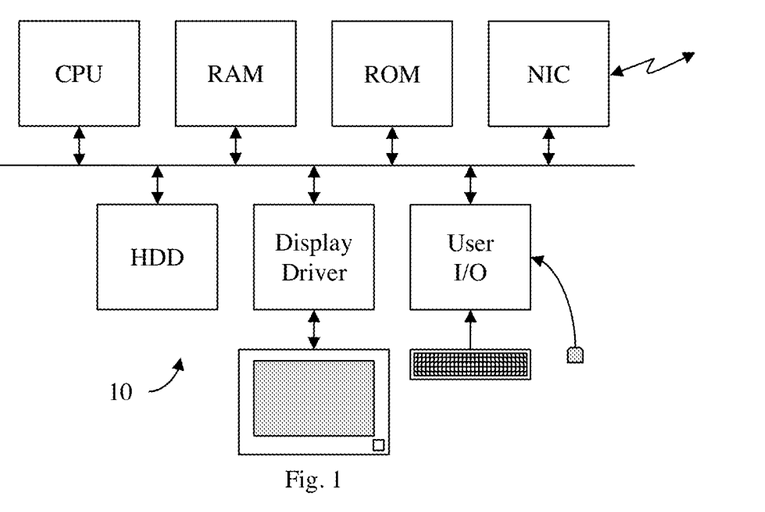
FIG. 1 illustrates, in block diagram form, a general purpose computer system adapted to practice the present invention.

Shown in FIG. 1 is a typical general purpose computer system 10. Although not all of the electronic components illustrated in FIG. 1 may be operable in the sub-threshold or near-threshold domains in any particular embodiment, some, at least, may be advantageously adapted to do so, with concomitant reductions in system power dissipation. In particular, in recently-developed battery-powered mobile systems, such as smart-phones and the like, many of the discrete components typical of desktop or laptop devices illustrated in FIG. 1 are integrated into a single integrated circuit ("IC") chip.

Figure 2:
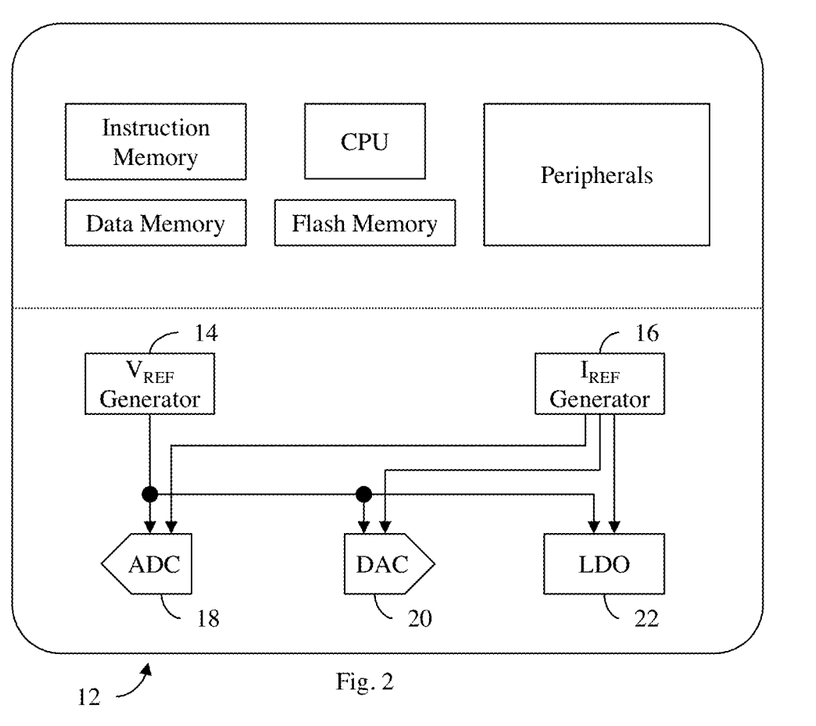
FIG. 2 illustrates, in block diagram form, a typical integrated system adapted to practice the present invention.

Shown in FIG. 2 is a typical integrated system 12 comprising, inter alia, reference voltage ("$V_{Ref}$") generator 14, reference current ("$I_{Ref}$") generator 16, an SAR ADC 18, a digital-to-analog converter ("DAC") 20 and a low-dropout ("LDO") regulator 22. An ADC 18 and a DAC 20 are generally considered to be fundamental components of nearly all modern ICs. The services they provide are often used by other functional blocks, and their power consumption may represent a non-trivial portion of the total power consumption of the entire chip.

Figure 3:
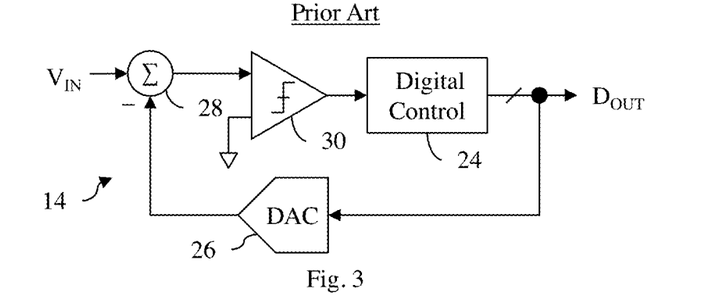
FIG. 3 illustrates, in block diagram form, a prior art embodiment of an SAR ADC.

The high-level architecture of a SAR ADC is shown in FIG. 3. To quantize the input voltage, $V_{IN}$, a Digital Control block 24, in concert with a feedback DAC 26, a summer 28, and a comparator 28, performs a binary search of all possible digital values to find the one that best approximates the analog input voltage. The sequence begins at mid-scale and ends with a digital output value, $D_{OUT}$, as close as possible to the voltage of the analog input, $V_{IN}$, for a given resolution.

Figure 4:
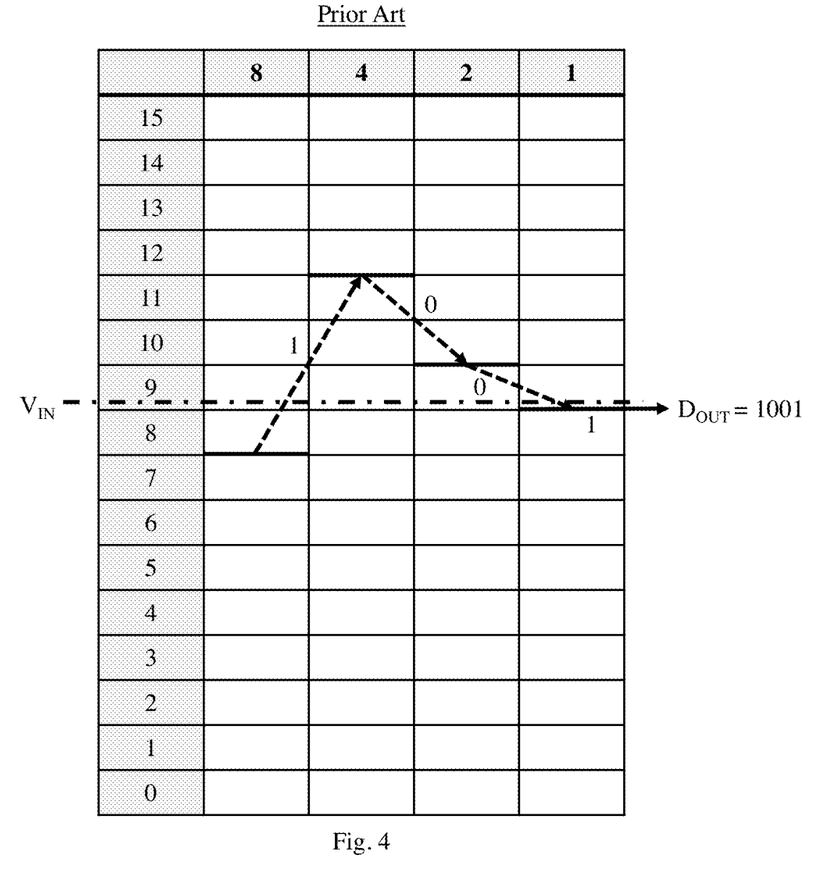
FIG. 4 illustrates, in tabular form, one example of a simple binary search by a 4-bit instance of the SAR ADC of FIG. 3.

FIG. 4 illustrates the operation of the binary search in the 4-bit ADC 14. The dot-dash line represents the sampled input voltage, $V_{IN}$, and the four (4) horizontal bold lines represent the output voltages developed by DAC 26 during the search. When $V_{IN}$ is above the DAC 26 output voltage, the comparator 30 outputs a logic_1 and the sequence moves up in the next cycle; conversely, when $V_{IN}$ is below the DAC 26 voltage, the comparator 30 outputs a logic_0 and the sequence moves down in the next cycle. In this example, the step size between consecutive DAC 26 output levels is proportional to the weighting factors for each column, i.e., 8, 4, 2, and 1.

Figure 5:
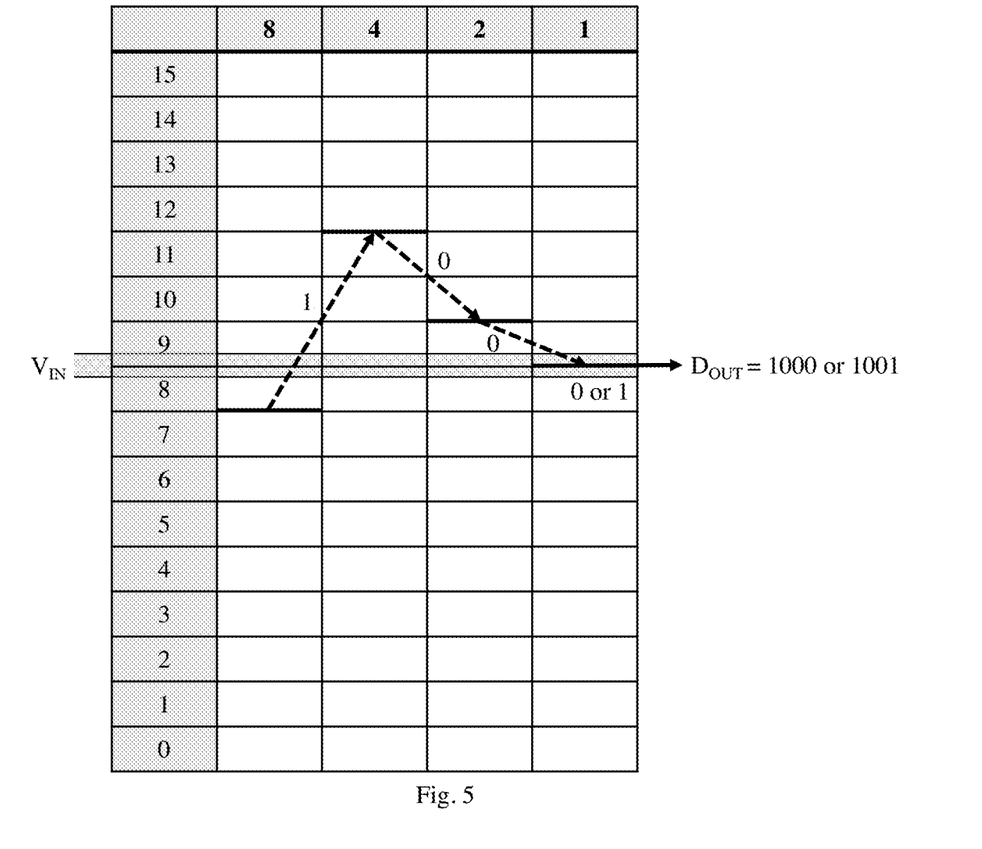
FIG. 5 illustrates, in tabular form, one example of a plurality of sequential binary searches by a 4-bit instance of the SAR ADC of FIG. 3, wherein the input signal changes slowly, and then only in the LSB of resolution.

When the input voltage $V_{IN}$ is nearly static, capturing multiple consecutive samples results in repetition of several steps of the binary search sequence. Consider the case of FIG. 5. Here a shaded rectangle is used to indicate a range of possible $V_{IN}$ values over multiple samples, wherein the input signal $V_{IN}$ changes slowly, and then only in the least-significant-bit ("LSB") of resolution. In this example, for values of $V_{IN}$ within this range, the DAC 26 sequence is exactly identical and only the final quantization operation for the LSB changes in each cycle. Repeating the first 3 comparisons in this DAC 26 sequence for each sample is a waste of time and power when it is already known that only the LSB will be changing from sample to sample.

Figure 6:
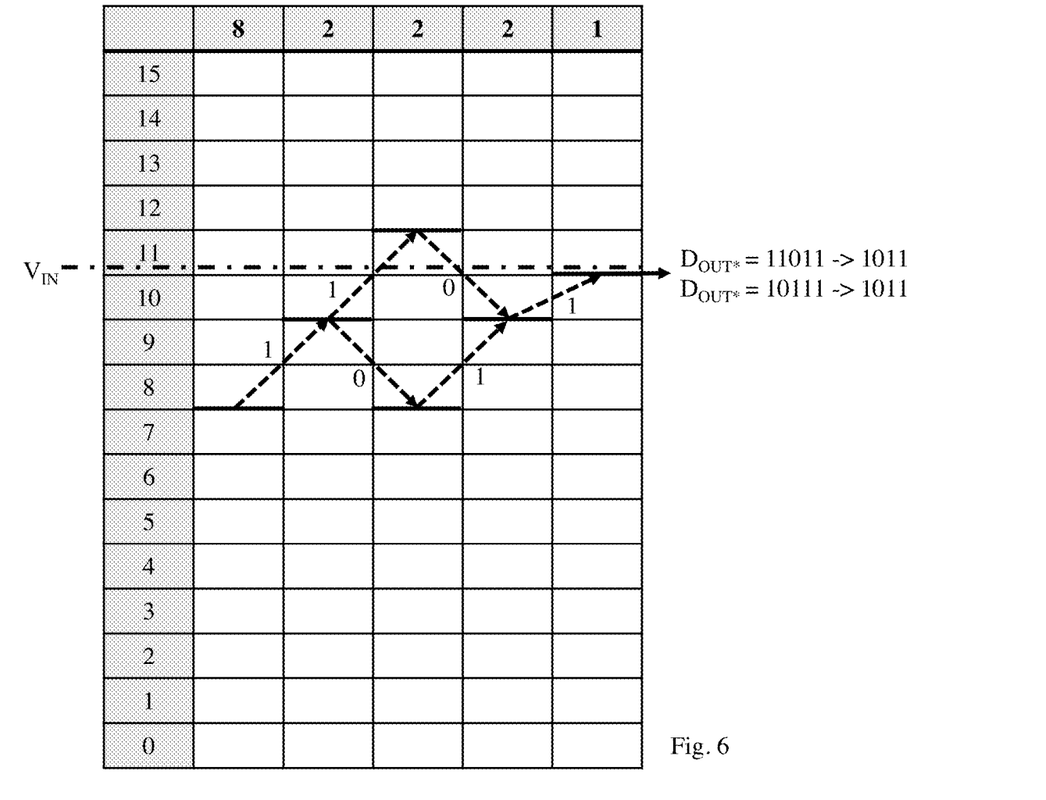
FIG. 6 illustrates, in tabular form, one example of a redundant binary search by a 4-bit instance of the SAR ADC of FIG. 3.

In high-resolution SAR ADCs, DAC settling time is a key factor limiting overall performance. To alleviate the settling requirements, a redundant search method with overlapping quantization regions is often used. Whereas the binary search algorithm quantizes one bit for each step and each comparison must be as accurate as the overall ADC, redundant algorithms take smaller steps after each comparison and allow for small errors. For example, FIG. 6 illustrates a redundant search sequence with two possible paths to the same ADC output value. Note that the "4" column from FIG. 4 has been broken into two "2"s. One advantage of a redundant search is that, if an error occurs on one of the redundant paths, the sequence is still able to attain the correct final value. Typically, post-processing of the 5-bit output produces a 4-bit value based on the 8-2-2-2-1 weighting.

What is needed is a method and apparatus for reducing average power consumption of a SAR ADC.

BRIEF SUMMARY OF THE INVENTION

In accordance with a first embodiment, a recursive method is provided for performing an analog-to-digital conversion ("ADC"). In accordance with a first step of this method, a search window is defined, the search window having a selected center and a selected width. In a second step, a first ADC result is developed as a function of the search window. If the first ADC result represents a selected one of an overflow condition and an underflow condition, the method returns to the first step; but, otherwise, the method updates the width and center of the search window as a function of the first ADC result, and returns to step two.

In accordance with a second embodiment, if the first ADC result represents a selected one of an overflow condition and an underflow condition, the method selectively expands the search window and develops a second ADC result as a function of the expanded search window. If the second ADC result represents a selected one of an overflow condition and an underflow condition, the method returns to the first step.

In accordance with another embodiment, an ADC facility is configured to perform any of the above methods.

In accordance with one other embodiment, an electronic system comprises this ADC facility.

In accordance with yet another embodiment, a non-transitory computer readable medium includes executable instructions which, when executed in a processing system, causes the processing system to perform the steps of the above method.

BRIEF DESCRIPTION OF THE SEVERAL VIEWS OF THE DRAWINGS

The invention may be more fully understood by a description of certain preferred embodiments in conjunction with the attached drawings in which.

In the drawings, similar elements will be similarly numbered whenever possible. However, this practice is simply for convenience of reference and to avoid unnecessary proliferation of numbers, and is not intended to imply or suggest that the invention requires identity in either function or structure in the several embodiments.

DETAILED DESCRIPTION OF THE INVENTION

Figure 7:
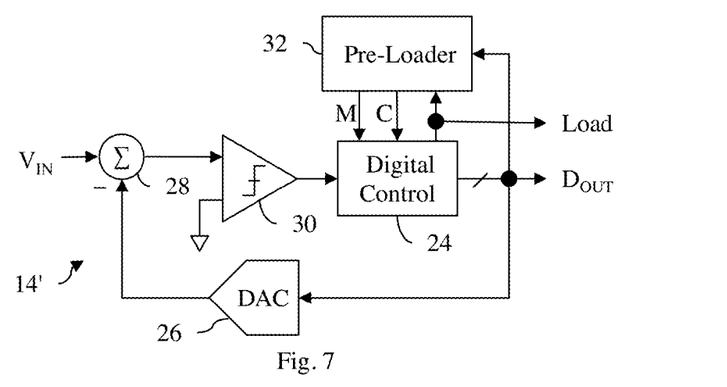
FIG. 7 illustrates, in block diagram form, one embodiment of a pre-loadable SAR ADC in accordance with the present invention.

Shown in FIG. 7 is an N-bit, pre-loadable SAR ADC 14' adapted to operate in accordance with the present invention. In accordance with the invention, a Pre-Loader facility 32 is provided selectively to develop two control values that together define a search window. The window location is defined here by its center value, C, and the window size is defined by the number of assumed bits, M, where a larger M corresponds to a smaller window. The actual output range in units of "bits" is a function of the redundancy algorithm and the total number of levels to be quantized. The use of a redundant search algorithm allows the search window to overlap the quantization boundaries of the upper, more significant bits.

Figure 8:
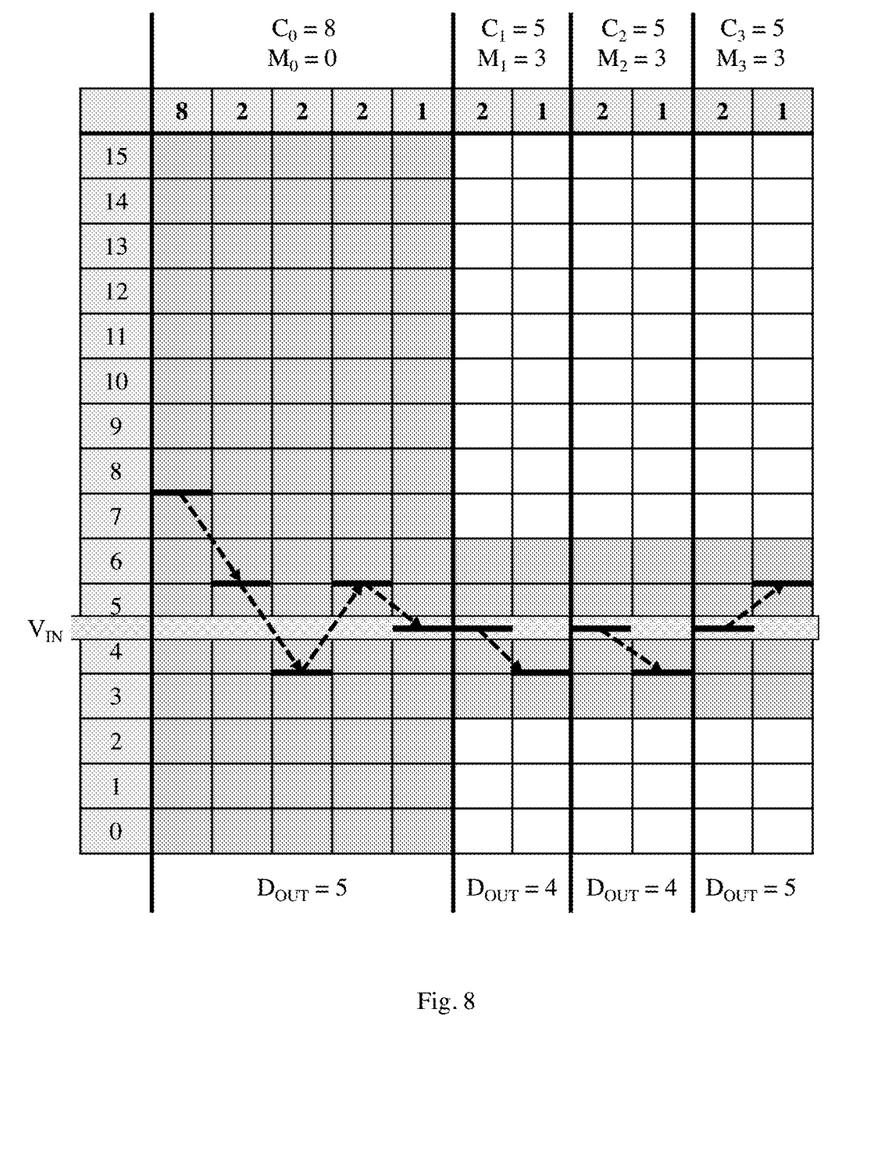
FIG. 8 illustrates, in tabular form, one example of a full pre-loaded search sequence by a 4-bit instance of the SAR ADC of FIG. 7.

C and M can be static or can be a function of the sample index, as illustrated in the following example preloading schemes. Each of these may or may not be implemented based on the application and the tradeoffs in complexity, risk, and power reduction:

1. No pre-loading: The ADC 14' can be configured without pre-loading enabled and thus operate like a normal SAR ADC with redundancy. In this configuration, C is fixed at mid-scale and M is held at 0, and the ADC 14' will operate as shown in FIG. 6.
2. Full conversion followed by sub-conversions: A typical set of multiple consecutive samples with a duty-cycled ADC 14' may resemble the example illustrated in FIG. 8. In this case, after the initial conversion, three bits (M=3) are assumed and C is set to 5. Variations on this approach are possible, e.g., allowing C progressively to approach the average digital output and M progressively to increase as more samples are taken and a higher level of confidence in the next ADC output is achieved.

Figure 9:
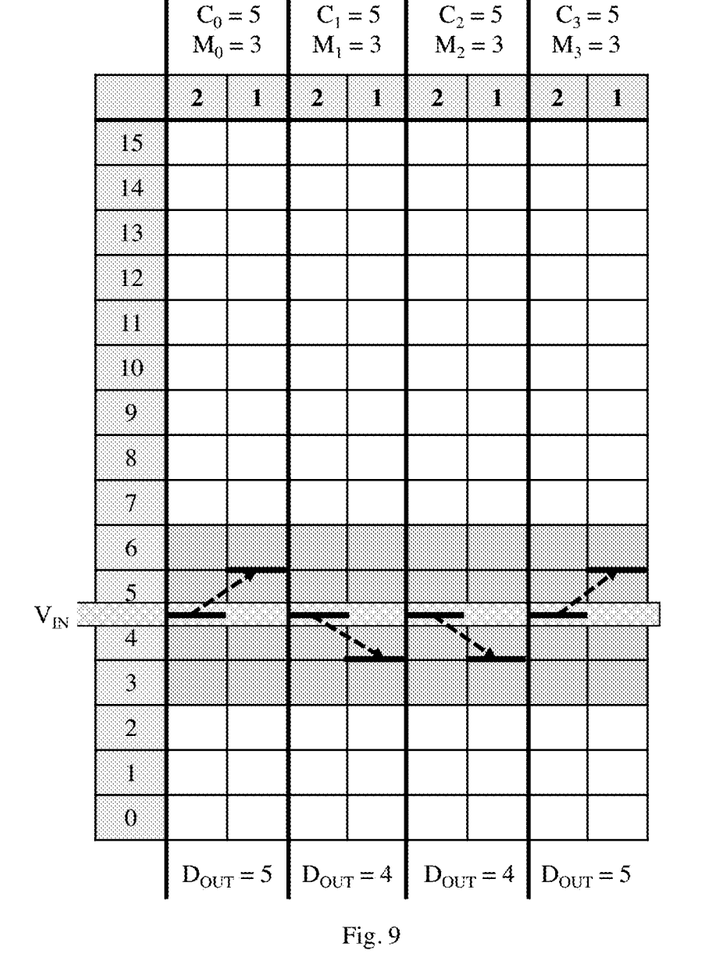
FIG. 9 illustrates, in tabular form, an example of an initial sub-conversion search sequence by a 4-bit instance of the SAR ADC of FIG. 7.

3. Initial sub-conversion: For applications in which a higher level of confidence in the output of the first ADC conversion is possible, more aggressive values for C and M may be chosen. In this configuration, the sample sequence may be as illustrated in FIG. 9.

Figure 10:
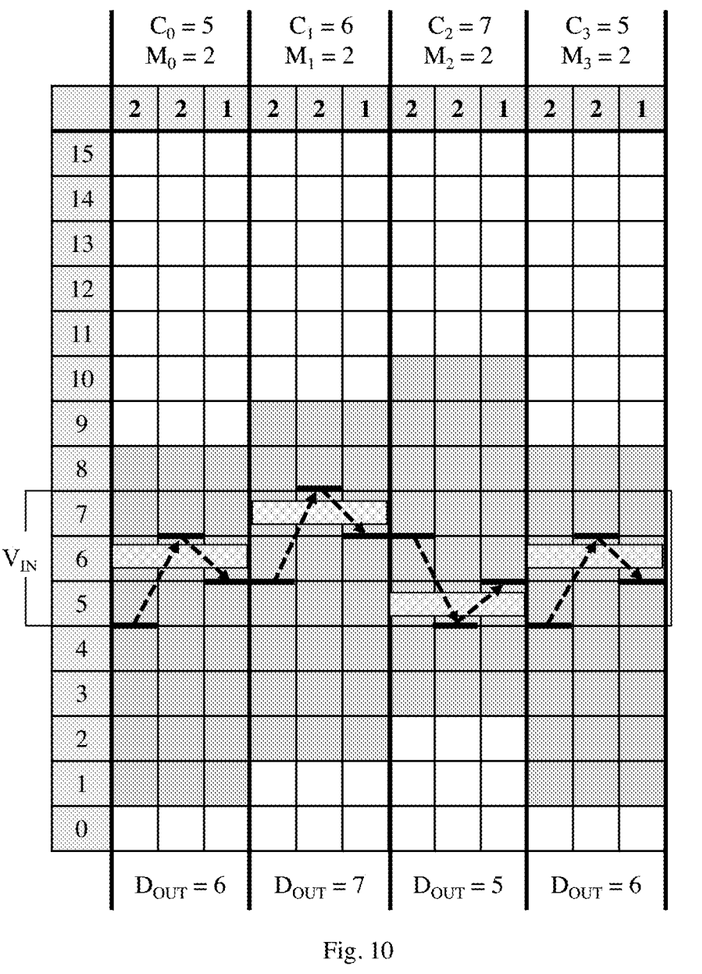
FIG. 10 illustrates, in tabular form, an example of the search sequence by a 4-bit instance of the SAR ADC of FIG. 7 in which the search window is selectively re-centered.

4. In the example illustrated in FIG. 10, $V_{IN}$ may not always be within the expected search window. For example, if the ADC 14' is run continuously or a large number of samples are taken, the input may drift away from its initial value. For applications such as this, it is desirable for the window to regularly re-center itself, as illustrated in FIG. 10.

Figure 11:
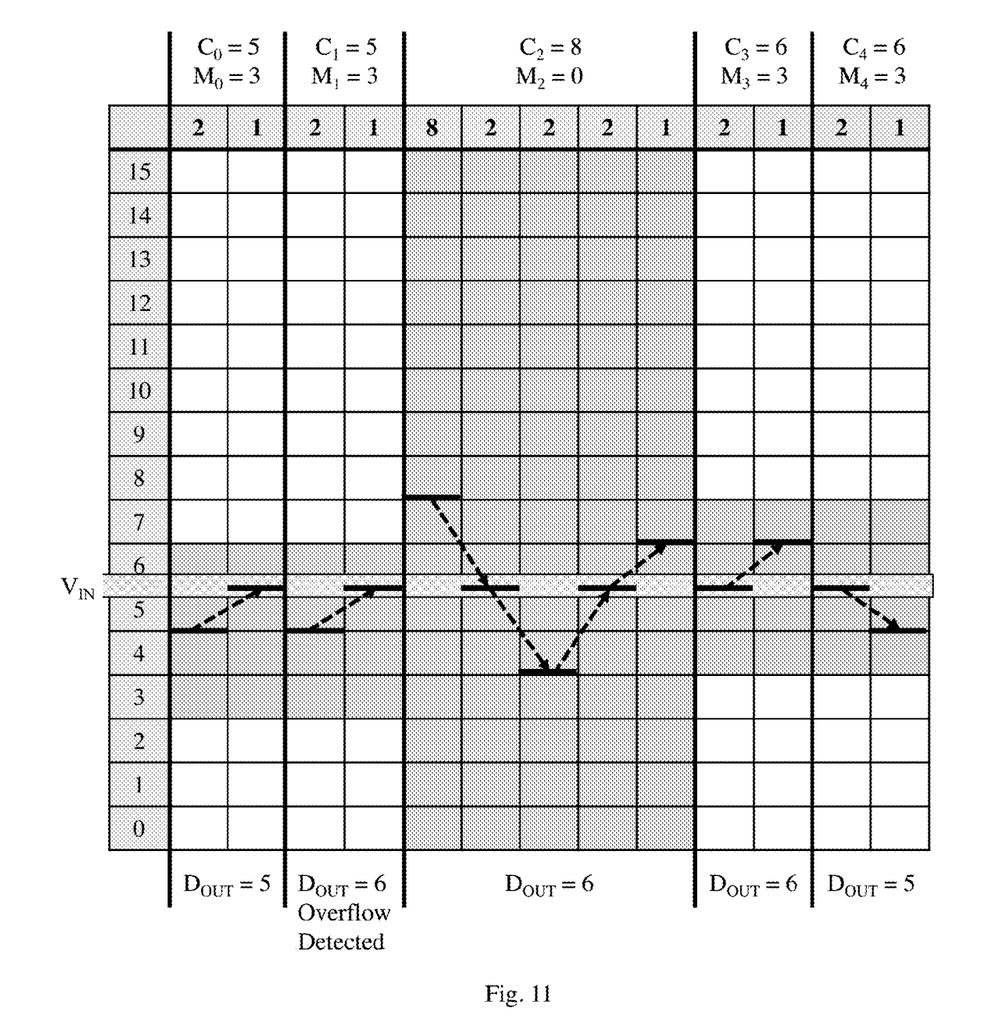
FIG. 11 illustrates, in tabular form, an example of the search sequence by a 4-bit instance of the SAR ADC of FIG. 7 when an overflow/underflow condition is detected.
Figure 12:
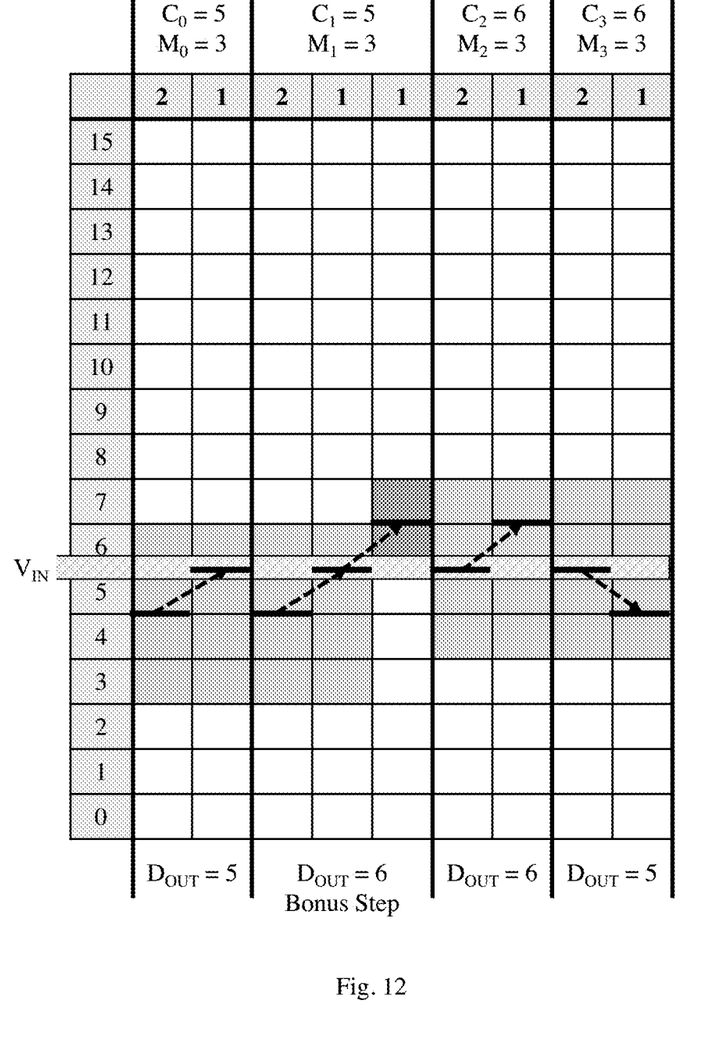
FIG. 12 illustrates, in tabular form, an example of the search sequence by a 4-bit instance of the SAR ADC of FIG. 7 which performs a bonus step when an overflow/underflow condition is detected.

5. Overflow/underflow detection: If the selection of C and M is too aggressive, the ADC output may hit the limits of the search window. When this happens, the digital output from the ADC 14' is unreliable, i.e., the input voltage may have exceeded the bounds of the search window. In one possible approach to correct for this, the out-of-range sample may be discarded and the ADC conversion repeated with more conservative values for C and M. In the example illustrated in FIGS. 11, C and M are returned to their default values and a full conversion is performed. After that, sub-conversions resume. In accordance with a less conservative approach to overflow/underflow correction, illustrated in FIG. 12, an additional "bonus step" may be performed at the end of a conversion cycle during which an overflow/underflow condition was detected. Considering the example illustrated in FIG. 11, in the second conversion cycle, $V_{IN}$ is compared to a DAC level of 6 resulting in a digital output of 6. If one additional comparison is performed against a DAC level of 7, the final digital output will be either 6 or 7: a 6 would indicate the correct digital output is 6; whereas a 7 would indicate the possibility of an overflow since, in this case, the true value may be anything from 7 to 15. In the latter case, this method could be performed again to check if the output is 7 or 8, although once the number of consecutive single-bit steps in this manner exceeds M, it is likely faster and less power to just perform a full ADC conversion sequence.

Selecting C: As will be recognized from these examples, the selection of C and M is important in determining the amount of power optimization possible with this technique. Values that are too conservative will reduce the achievable power improvement, and values that are too aggressive will result in either large output errors or efficiency loss when samples are re-taken. The center of the window, C, represents the best-guess of the next ADC output. For slowly-varying inputs, it is simply the average of the previous outputs. For faster-varying inputs, the next output could be predicted based on the ramp rate of the previous inputs. Other variations are possible.

Figure 13:
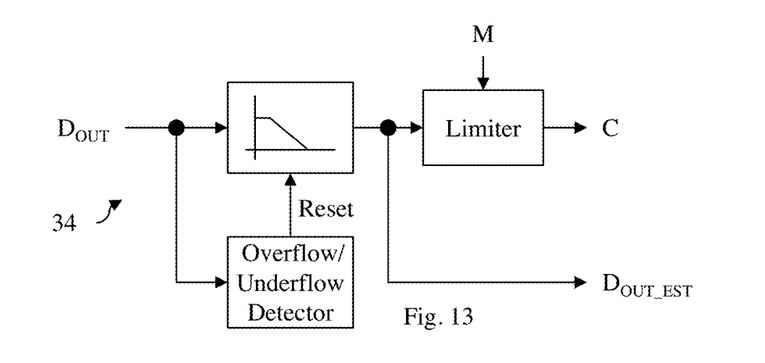
FIG. 13 illustrates, in block diagram form, one embodiment of a C selection facility adapted for use in a pre-loadable SAR ADC in accordance with the present invention.

Generally speaking, C should not be chosen such that the upper or lower limits of the search window exceed the ADC output range. Doing so only risks an overflow or underflow error without any power advantage. Thus, it can be seen that the min and max bounds of C are therefore a function of M. By way of example, shown in FIG. 13 is one possible embodiment of the control loop for C. In this implementation, an overflow or underflow event forces C back to its mid-scale value.

Figure 14:
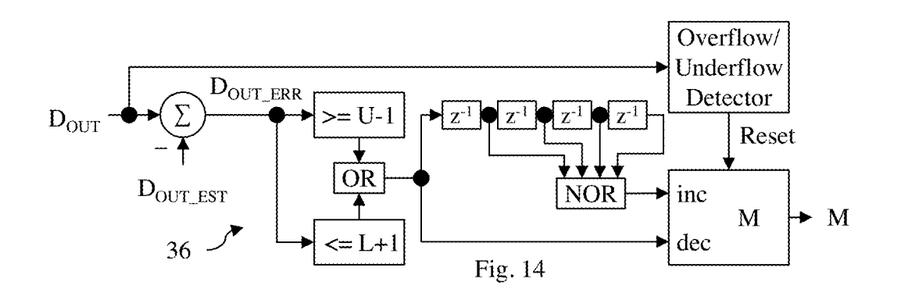
FIG. 14 illustrates, in block diagram form, one embodiment of an M selection facility adapted for use in a pre-loadable SAR ADC in accordance with the present invention.

Selecting M: The number of assumed bits, M, is a function of the variation in the ADC output from sample to sample. A noisy ADC or a noisy input source will require a smaller M than a low noise ADC and a low noise input source. Illustrated in FIG. 14 is one possible implementation for the selection of M. In this embodiment, the error in the original estimate, $D_{OUT\_ERR}$, is calculated as the difference between the ADC output, $D_{OUT}$, and the estimated output, $D_{OUT\_EST}$. This error is then compared to the upper bound of the window, U, and the lower bound of the window, L. If the error is within one (1) bit of these limits, then M is decremented to widen the window. If a selected set of prior outputs are within the window, in this case four (4), then M is incremented. If an overflow or an underflow is detected, M is reset to 0.

Figure 15:
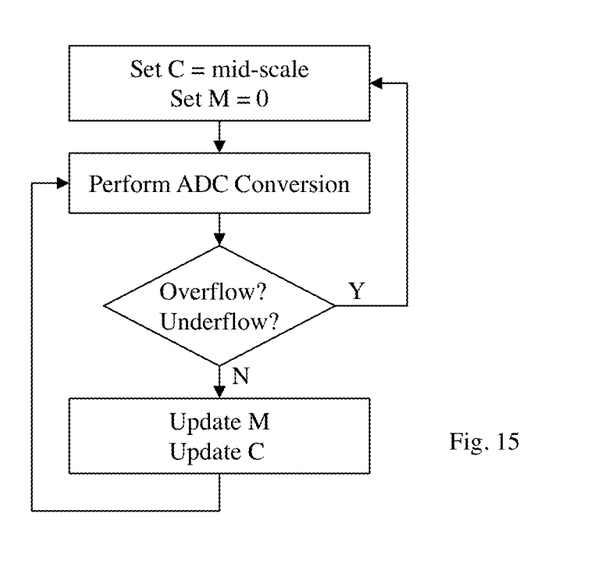
FIG. 15 illustrates, in flow diagram form, one method adapted for use in a pre-loadable SAR ADC for selecting M and C in accordance with the present invention.

In the implementations above, it is clear that the calculations of C and M are coupled, and, thus, dependent on each other. In general and especially for slowly varying inputs, the input level is capable of changing faster than the statistics of the input signal. Thus, it is preferable that C be updated more often than M. By way of example, one embodiment of a method for selectively calculating M and C is illustrated in FIG. 15.

It will be apparent to those skilled in the art that various modifications and variations can be made without departing from the spirit or scope of the invention. Thus, it is intended that the disclosed embodiments cover modifications and variations that come within the scope of the claims that eventually issue in a patent(s) originating from this application and their equivalents. In particular, it is explicitly contemplated that any part or whole of any two or more of the embodiments and their modifications described above can be combined in whole or in part.

What is claimed is:

1. A method for performing an analog-to-digital conversion ("ADC"), the method comprising the steps of:
   [1.1] defining a search window having a selected center and a selected width;
   [1.2] developing a first ADC result as a function of the search window;
   [1.3] if the first ADC result represents a selected one of an overflow condition and an underflow condition:
      [1.3.1] if the first ADC result represents the underflow condition, selectively adjusting the selected center of said search window higher;
      [1.3.2] if the first ADC result represents the overflow condition, selectively adjusting the selected center of the search window lower;
      [1.3.3] developing a second ADC result as a function of the search window; and
      [1.3.4] if the second ADC result represents a selected one of an overflow and an underflow condition, returning to step [1.1]; and
   [1.4] otherwise, updating the width and center of the search window as a function of the first ADC result, and returning to step [1.2].

2. The method of claim 1 wherein step [1.4] is further characterized as comprising the steps of:
   [1.4.1] updating the center of the search window as a function of a selected first set of the first ADC results;
   [1.4.2] updating the width of the search window as a function of a selected second set of the first ADC results; and
   [1.4.3] returning to step [1.2].

3. The method of claim 1 wherein step [1.1] is further characterized as comprising the steps of:

[1.1.1] setting a search window center selector, C, to a first predetermined value; and

[1.1.2] setting a search window width selector, M, to a second predetermined value.

4. The method of claim 3 wherein step [1.4] is further characterized as comprising the steps of:

[1.4.1] updating C as a function of a selected first set of the first ADC results;

[1.4.2] updating M as a function of a variation in a selected second set of the first ADC results; and

[1.4.3] returning to step [1.2].

5. The method of claim 4 wherein step [1.4.1] is further characterized as updating C as a function of a predicted ramp of a plurality of previous said first set of ADC results.

6. The method of claim 1 wherein step [1.3.4] is further characterized as comprising the steps of:

[1.3.4] if the second ADC result represents a selected one of an overflow condition and an underflow condition:

[1.3.4.1] selectively expanding the search window;

[1.3.4.2] developing a third ADC result as a function of the expanded search window; and

[1.3.4.3] if the third ADC result represents a selected one of an overflow condition and an underflow condition, returning to step [1.1].

7. The method of claim 1 wherein step [1.3.1] and step [1.3.2] are further characterized as selectively reducing the width of said search window.

8. An ADC configured to perform the method of any preceding claim.

9. An electronic system comprising an ADC according to claim 8.

10. A non-transitory computer readable medium including executable instructions which, when executed in a processing system, causes the processing system to perform the steps of a method according to any one of claims 1 to 6.

* * * * *